(12) United States Patent
Bae

(10) Patent No.: US 8,022,409 B2
(45) Date of Patent: Sep. 20, 2011

(54) SEMICONDUCTOR DEVICE WITH OMEGA GATE AND METHOD FOR FABRICATING A SEMICONDUCTOR DEVICE

(75) Inventor: Sang-Man Bae, Kyoungki-do (KR)

(73) Assignee: Hynix Semiconductor, Inc. (KR)

( * ) Notice: Subject to any disclaimer, the term of this patent is extended or adjusted under 35 U.S.C. 154(b) by 88 days.

(21) Appl. No.: 11/893,519

(22) Filed: Aug. 16, 2007

(65) Prior Publication Data
US 2007/0284691 A1    Dec. 13, 2007

Related U.S. Application Data

(62) Division of application No. 11/322,289, filed on Dec. 29, 2005, now Pat. No. 7,276,410.

(30) Foreign Application Priority Data

Jan. 31, 2005  (KR) .................. 10-2005-0008741

(51) Int. Cl.
*H01L 31/112* (2006.01)
*H01L 29/12* (2006.01)
*H01L 21/8234* (2006.01)

(52) U.S. Cl. .............. 257/68; 257/71.905; 438/243

(58) Field of Classification Search ............... 257/68, 257/71, 905, E27.084, 21.647; 438/243, 438/386
See application file for complete search history.

(56) References Cited

U.S. PATENT DOCUMENTS

| 5,064,777 | A   |   | 11/1991 | Dhong et al. | 438/242 |
|-----------|-----|---|---------|--------------|---------|
| 5,198,384 | A   | * | 3/1993  | Dennison     | 438/3   |
| 6,204,140 | B1  | * | 3/2001  | Gruening et al. | 438/386 |
| 6,337,241 | B1  | * | 1/2002  | Aoki         | 438/243 |
| 6,465,299 | B1  |   | 10/2002 | Son          | 438/270 |
| 6,573,548 | B2  |   | 6/2003  | Leung et al. | 257/296 |

FOREIGN PATENT DOCUMENTS

| CN | 1272668 A   | 11/2000 |
|----|-------------|---------|
| CN | 1503368 A   | 6/2004  |
| KR | 2000-0063008 | 10/2000 |

* cited by examiner

*Primary Examiner* — Howard Weiss
*Assistant Examiner* — Steven H Rao
(74) *Attorney, Agent, or Firm* — Blakely, Sokoloff, Taylor & Zafman

(57) ABSTRACT

A substrate has an active region divided into storage node contact junction regions, channel regions and a bit line contact junction region. Device isolation layers are formed in the substrate isolating the active region from a neighboring active region Recess patterns are formed each in a trench structure and extending from a storage node contact junction region to a channel region Line type gate patterns, each filling a predetermined portion of the trench of the individual recess pattern, is formed in a direction crossing a major axis of the active region in an upper portion of the individual channel region.

9 Claims, 15 Drawing Sheets

SEMICONDUCTOR DEVICE WITH OMEGA GATE AND METHOD FOR FABRICATING A SEMICONDUCTOR DEVICE

The present patent application is a Divisional of application Ser. No. 11/322,289, filed Dec. 29, 2005 now U.S. Pat. No. 7,276,410.

FIELD OF THE INVENTION

An embodiment of the invention relates to the technology of fabricating a semiconductor device; and more particularly, to a semiconductor device with a recess gate and a method for fabricating the same.

DESCRIPTION OF RELATED ARTS

Typically, in a dynamic random access memory (DRAM) cell structure having a planar type N-channel metal oxide semiconductor field-effect transistor (NMOSFET), it is difficult to control refresh time, due to an increased electric field resulting from an increase in a boron concentration of a channel for which a design rule has been decreased.

Accordingly, a step gated asymmetric recess (STAR) cell having a step type active region is suggested. The STAR cell has the step type active region which differentiates a height of a central portion of the active region from that of an edge portion of the active region by leaving the central portion, i.e., a bit line portion, of the active region as it is but by recessing only the edge portion, i.e., a storage node portion, of the active region by approximately several nm.

If the STAR cell is fabricated as described above, it is possible to secure a channel length longer than a channel length that has been decreased due to integration of the device.

FIG. 1 is a cross-sectional view illustrating a conventional planar type normal DRAM cell structure.

Referring to FIG. 1, a device isolation layer 12 is formed in a substrate 11 and then, a plurality of gate oxide layers 14 are formed on upper portions of an active region 13 defined by the device isolation layer 12. Afterwards, a plurality of gate electrodes 15 are formed on the gate oxide layers 14.

Also, a plurality of dual gate spacers, each formed by using an oxide layer spacer 16 and a nitride layer spacer 17 are formed on both sidewalls of each of the gate electrodes 15.

A source/drain junction 18 is formed in the active region 13 between the gate electrodes 15 through ion-implantation process. Herein, the source/drain junction 18 is referred as a storage node (SN) junction to which a storage node will be connected.

FIG. 2 is a cross-sectional view illustrating a conventional STAR cell structure.

Referring to FIG. 2, a device isolation layer 22 is formed in a substrate 21. A plurality of gate oxide layers 24 are formed on upper portions of an active region 23 defined by the device isolation layer 22 and then, a plurality of gate electrodes 25 are formed on the gate oxide layers 24.

A plurality of dual gate spacers, each formed by using an oxide layer spacer 26 and a nitride layer spacer 27 are formed on both sidewalls of each of the gate electrodes 25.

A plurality of source/drain junctions 28 and 29 are formed in the active region 23 between the gate electrodes 25 through an ion-implantation process. Herein, the source/drain junction 28 formed in one side of the respective gate electrode 25 is referred as a storage node (SN) junction 28 to which a storage node will be connected and the other source/drain junction 29 formed in the other side of the respective gate electrode 25 is referred as a bit line (BL) junction 29 to which a bit line will be connected.

As shown in FIG. 2, the active region 23 has a step type structure. That is, the SN junction 28 is formed on a planarized recess region having a height difference and accordingly, the SN junction 28 is formed in a lower portion than where the BL junction 29 is.

In accordance with the conventional STAR cell structure shown in FIG. 2, a refresh property can be improved since an effective channel length defined beneath the gate electrodes 25 becomes noticeably increased compared with the planar type normal DRAM cell structure shown in FIG. 1.

However, in the conventional planar type normal DRAM cell structure, it is difficult to secure tREF in a sub 100 nm device due to a boron diffusion of a channel.

As the STAR cell structure shown in FIG. 2 uses a line/space (L/S) type photomask for forming the recess region, the planarized recess region having the height difference is formed. Thus, the STAR cell structure provides the same contact area over which the SN junction 28 and the device isolation layer 22 are contacted with each other as that of the normal DRAM cell structure shown in FIG. 1. Accordingly, FIG. 2 only provides an effect in improving the channel length through a cell-halo (C-halo) process.

FIG. 3A is a top view illustrating a plurality of recess masks (RM) for forming a recess region in the STAR cell shown in FIG. 2. Herein, the same reference numerals used in FIG. 2 are used to denote the same constituent elements. The line/space (L/S) type recess masks (RM) open at not only a portion where the plurality of SN junctions 28 are formed between the gate electrodes 25, but also at predetermined portions of the device isolation layer 22 adjacent to the SN junctions 28.

FIG. 3B is a cross-sectional view illustrating a portion that will be recessed by the recess mask (RM) shown in FIG. 3A. Herein, the same reference numerals used in FIG. 2 are also used to denote the same constituent elements. A region R recessed by using the line/space (L/S) type recess mask (RM) includes not only the active region 23 where the SN junction 28 will be formed but also the predetermined portions of the device isolation layer 22 adjacent to the active region 23.

Furthermore, there is a height difference with a size of approximately 500 Å in both sides of a gate pattern in the STAR cell structure. Due to the height differences, a SN junction may be formed deeply thereafter. Thus, the deeply formed SN junction becomes weak with respect to pattern formation and induces a deteriorating electrical property. Accordingly, this limitation may cause a resistance problem in a storage node.

SUMMARY OF THE INVENTION

An embodiment of the invention is a semiconductor device capable of improving a refresh property by increasing a channel length and a resistance property of a storage node. Fabrication methods for making the device are also described.

In accordance with one aspect of the present invention, there is provided a semiconductor device, including: a substrate including an active region divided into a plurality of storage node contact junction regions, a plurality of channel regions and a bit line contact junction region; a plurality of device isolation layers formed in the substrate and isolating the active region from a neighboring active region; a plurality of recess patterns, each formed in a trench structure and extending from the storage node contact junction regions to the channel regions; a plurality of line type gate patterns, each filling a predetermined portion of the trench of the individual recess pattern, and formed in a direction crossing a major axis of the active region in an upper portion of the individual channel region; and a plurality of storage node junctions formed in the storage node contact junction regions.

In accordance with another aspect of the present invention, there is provided a method for fabricating a semiconductor device, including: forming a plurality of device isolation layers in predetermined portions of a substrate; forming a plurality of trench type recess patterns formed by etching predetermined portions of the active region divided into a plurality of storage node contact junction regions, a plurality of channel regions and a bit line contact junction region by the device isolation layers, wherein each of the plurality of recess patterns extends from the corresponding storage node contact junction region to the corresponding channel region; forming a gate oxide layer on an entire surface of the substrate; forming a plurality of gate patterns on the gate oxide layer disposed in upper portions of the plurality of channel regions having a step structure due to the recess patterns; and forming a plurality of storage node contact junctions by performing an ion-implantation to the storage node contact junction regions having a step structure due to the recess patterns.

In accordance with further aspect of the present invention, there is provided a semiconductor device, including: a substrate including an active region divided into a plurality of storage node contact junction region, a plurality of channel regions and a bit line contact junction region; a plurality of device isolation layers formed in the substrate and isolating the active region from a neighboring active region; a plurality of recess patterns, each formed in a trench structure and extending from the storage node contact junction regions to the channel regions; and a plurality of line type gate patterns, each filling a predetermined portion of the trench of the individual recess pattern, and formed in a direction crossing a major axis of the active region in an upper portion of the individual channel region.

BRIEF DESCRIPTION OF THE DRAWINGS

The above features will become better understood with respect to the following description of the specific embodiments of the invention given in conjunction with the accompanying drawings, in which.

DETAILED DESCRIPTION OF THE INVENTION

Figure 1:
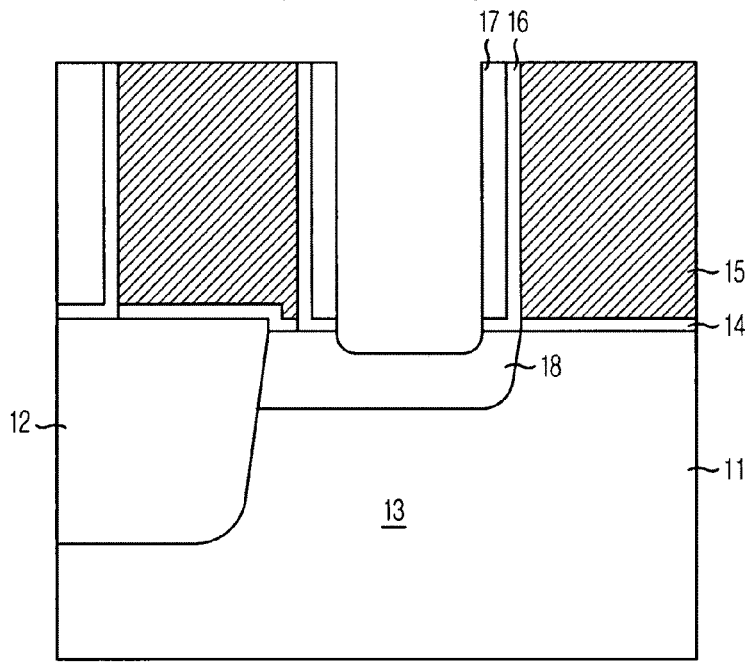
FIG. 1 is a cross-sectional view illustrating a conventional planar type normal dynamic random access memory (DRAM) cell structure.
Figure 2:
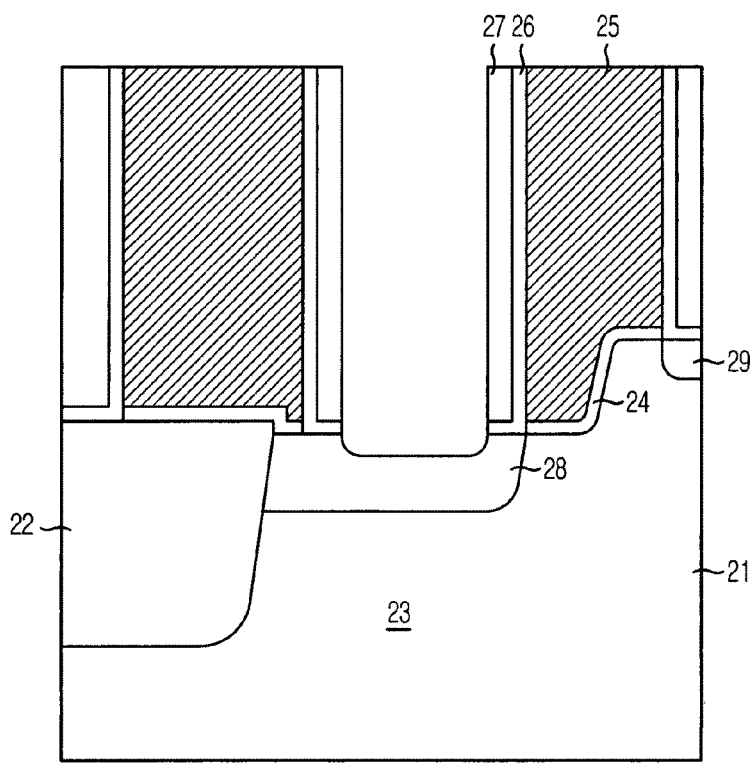
FIG. 2 is a cross-sectional view illustrating a conventional step gated asymmetric recess (STAR) cell structure.
Figure 3A:
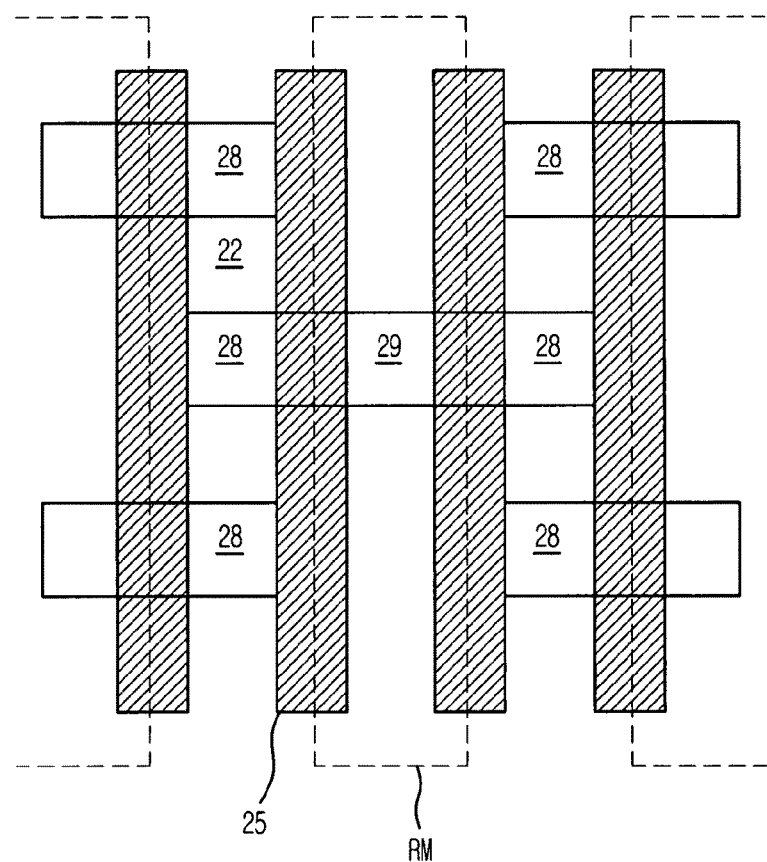
FIG. 3A is a top view illustrating a plurality of photomasks (PM) for forming a recess region in the STAR cell structure shown in FIG. 2.
Figure 3B:
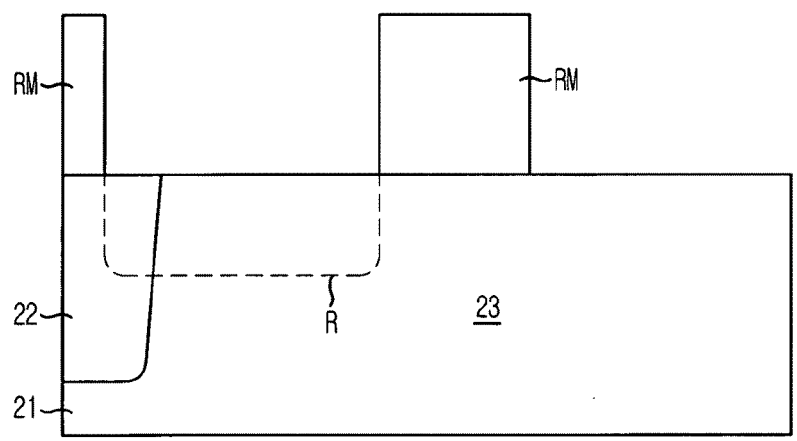
FIG. 3B is a cross-sectional view illustrating a region that will be recessed by the photomasks (PM) shown in FIG. 3A.

Hereinafter, detailed descriptions of certain embodiments of the present invention will be provided with reference to the accompanying drawings. It should be noted that like reference numerals denote like elements even in different drawings.

FIGS. 4A to 4E are cross-sectional views illustrating a method for fabricating a semiconductor device in accordance with a first embodiment of the present invention and FIGS. 5A to 5D are top views illustrating a method for fabricating a semiconductor device in accordance with the first embodiment of the present invention. Herein, FIGS. 4A to 4D are cross-sectional views taken along in the direction of a line X-X' shown in FIGS. 5A to 5D.

Figure 4A:
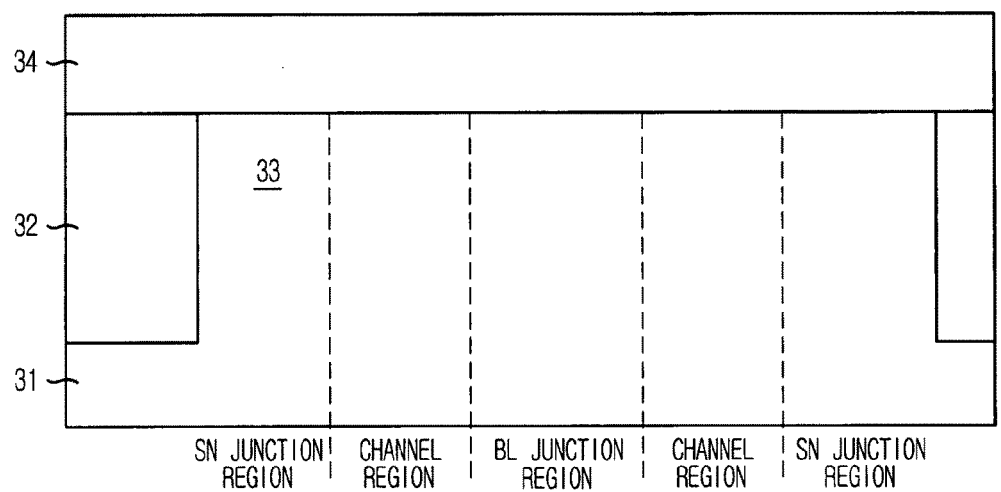
FIGS. 4A to 4E are cross-sectional views illustrating a method for fabricating a semiconductor device in accordance with a first embodiment of the present invention.
Figure 5A:
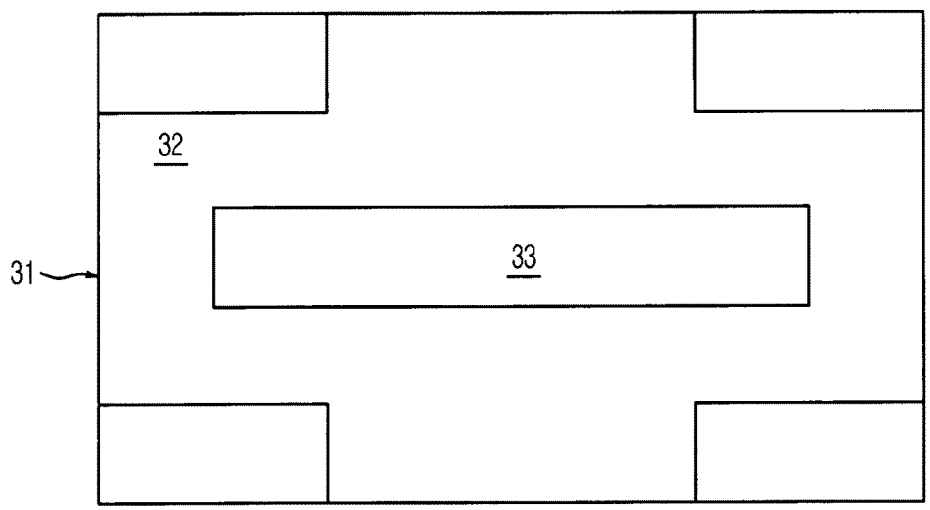
FIGS. 5A to 5D are top views illustrating a method for fabricating a semiconductor device in accordance with the first embodiment of the present invention.

As shown in FIGS. 4A and 5A, a plurality of device isolation layers 32 are formed in predetermined portions of a substrate 31 by using a shallow trench isolation (STI) process. An active region 33 is defined by the device isolation layers 32 and the active region 33 is divided into a plurality of storage node (SN) junction regions, a bit line (BL) junction region and a plurality of channel regions. Herein, as shown in FIG. 5A, the device isolation layer 32 serves a role in isolating the neighboring active regions 33 from each other and the active region 33 has a major axis and a minor axis.

Figure 4B:
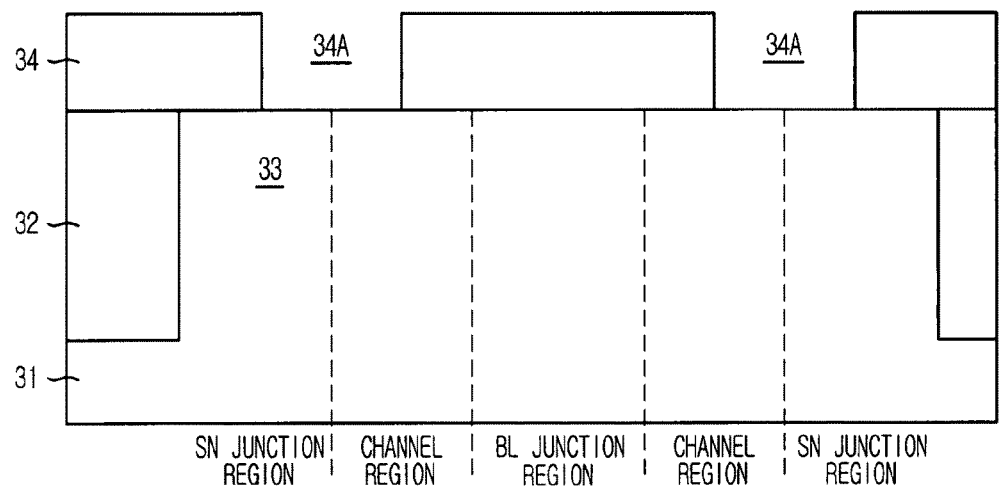
Figure 5B:
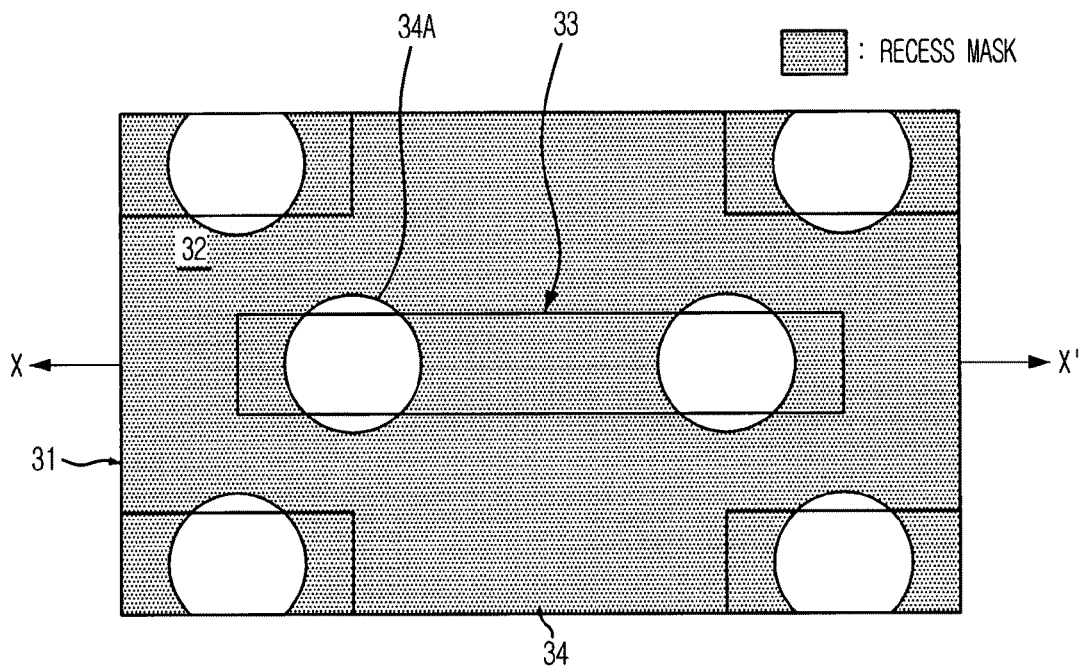

As shown in FIGS. 4B and 5B, a photoresist layer is deposited on an upper portion of the active region 33 defined by the device isolation layers 32 and afterwards, the photoresist layer is patterned through a photo-exposure process and a developing process. Thus, a plurality of recess masks 34 are formed.

At this time, the recess masks (RM) 34 are etch masks for forming a step type active region structure by recessing predetermined portions of the active region 33 and the recess masks 34 have a plurality of trench type openings 34A.

In greater detail, the recess masks (RM) 34 completely cover the device isolation layers 32 and the openings 34A open the predetermined portions of the SN junction regions and the channel regions to be formed.

Accordingly, the trench type openings 34A are not to recess the device isolation layers 32 and thus, the recess masks (RM) 34 having the trench type openings 34A are different from the line/space (L/S) type recess mask (RM) recessing up to a portion where the device isolation layer is formed.

Figure 4C:
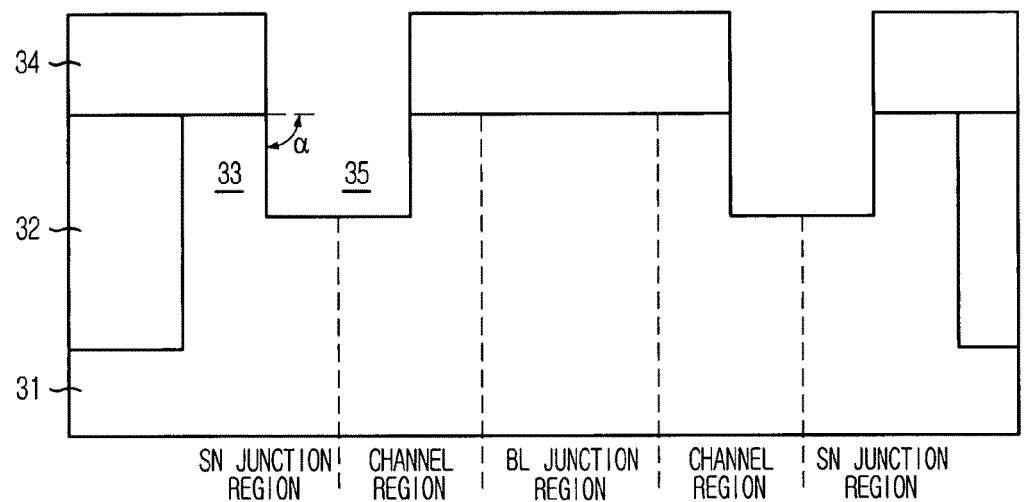
Figure 5C:
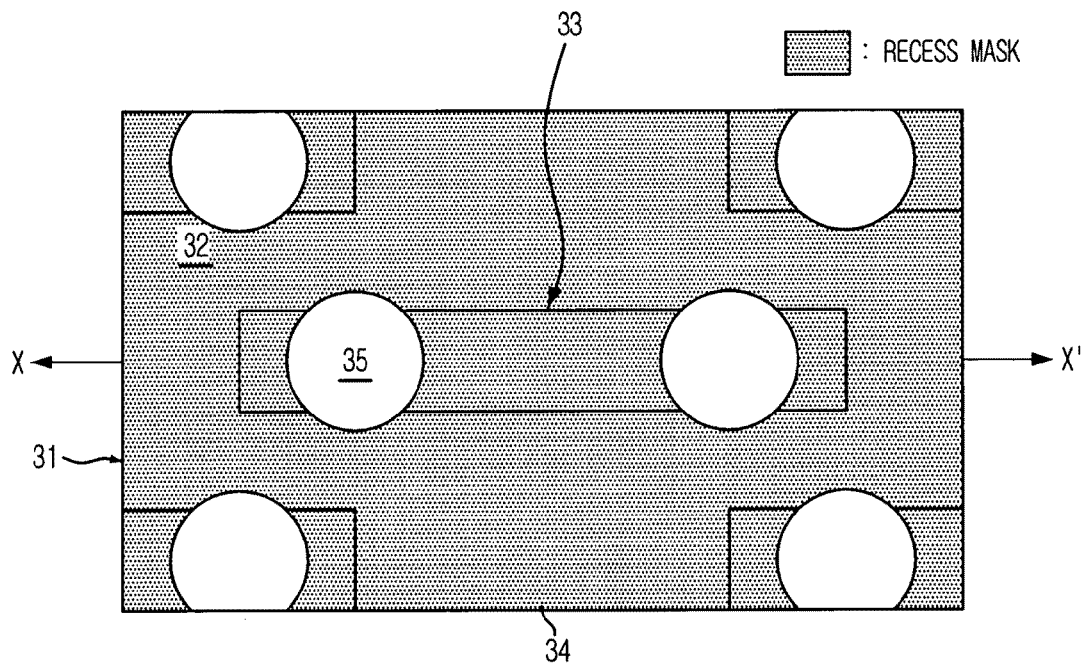

As shown in FIGS. 4C and 5C, the substrate 31 exposed by the openings 34A, with use of the recess masks (RM) 34 as an etch barrier, is etched in a predetermined depth, thereby forming a plurality of trench type recess patterns 35.

At this time, a depth of the individual recess pattern 35 ranges from approximately 30 Å to approximately 500 Å and an angle α alpha at which the individual recess pattern 35 is etched is controlled within a range between approximately 10° and approximately 90°.

As described above, if the trench type recess patterns 35 are formed, subsequent storage node junction regions are provided in a well/trench type, thereby increasing a contact area between an individual gate electrode that will be formed later and the individual SN junction region.

Figure 4D:
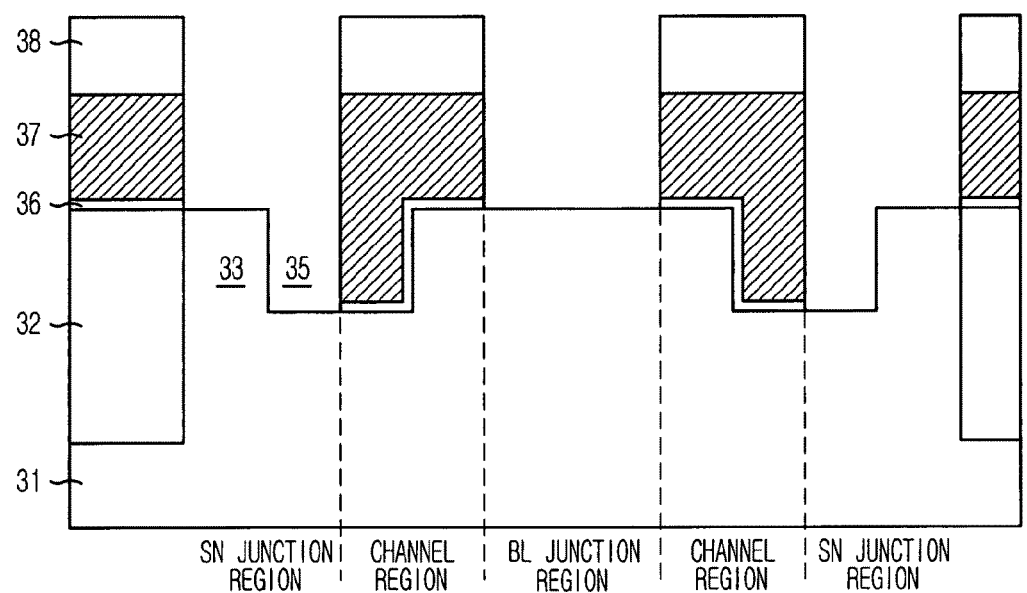
Figure 5D:
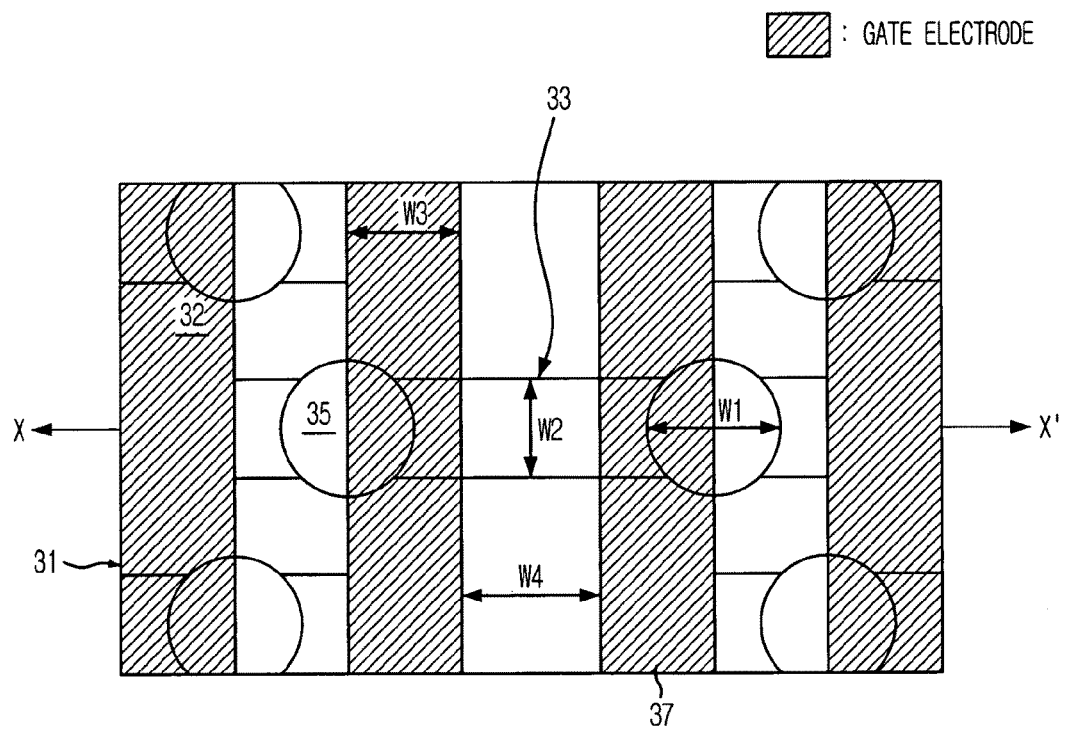

As shown in FIGS. 4D and 5D, the recess masks (RM) 34 are removed and afterwards, a gate oxide layer 36 is formed on a surface of the resulting structure. Then, a gate electrode material and a gate hard mask material are deposited on the gate oxide layer 36. Thereafter, a gate patterning is performed and thus, a plurality of gate patterns are formed by sequentially stacking gate electrodes 37 and gate hard masks 38.

At this time, the gate electrodes 37 overlap some portions of the recess patterns 35 and extend into other portions of the recess patterns 35 with a height difference.

In greater detail, one side of the individual gate electrode 37 is formed on a higher surface of the active region 33; the other side of the individual gate electrode 37 is formed on a bottom side of the individual recess pattern 35; and an edge of the other side of the individual gate electrode 37 is located at the center of the individual trench type recess pattern 35.

As shown in FIG. 5D, if assuming that a diameter of the individual recess pattern 35 is W1; a width of the minor axis of the active region 33 is W2; a width of a minor axis of the individual gate electrode 37 is W3; and a width between the neighboring gate electrodes 37 is W4, the diameter W1 of the individual recess pattern 35 is greater than the width W2 of the minor axis of the active region 33. For instance, the width W2 of the minor axis of the individual recess pattern 35 may have a size of approximately 95 nm; however, the diameter W1 of the individual recess pattern 35 may have a size of approximately 115 nm. Meanwhile, the width W3 of the minor axis of the individual gate electrode 37 may have a size of approximately 105 nm and the width W4 between the neighboring gate electrodes 37 is set at a size of approximately 95 nm, and a radius of the individual recess pattern 35 is smaller than the width W3 of the minor axis of the individual gate electrode 37.

The edge of the individual gate electrode 37 is placed at the center of the individual trench type recess pattern 35.

Figure 4E:
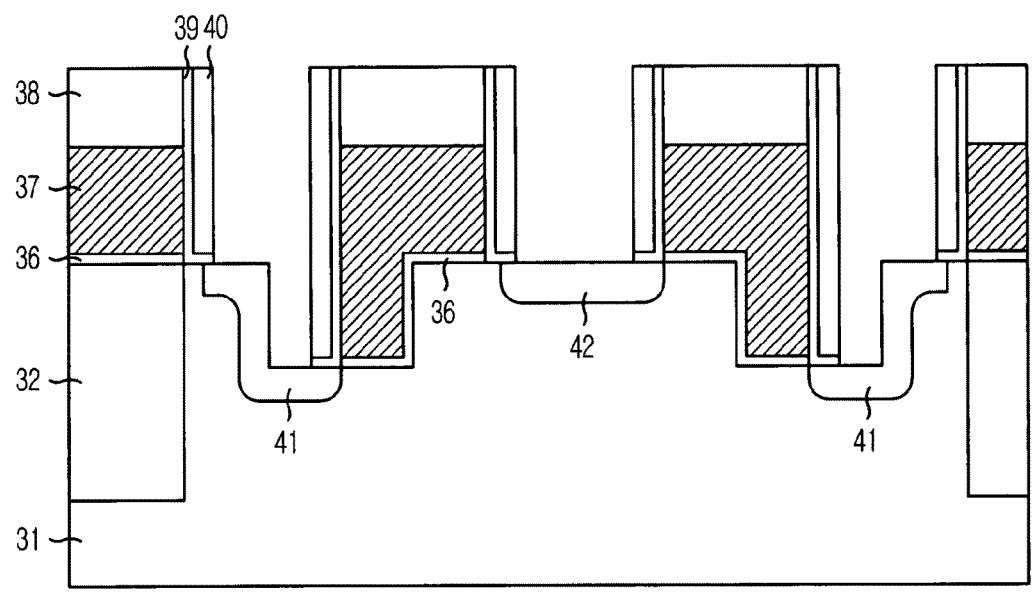

Next, as shown in FIG. 4E, a plurality of dual gate spacers of an oxide layer spacer 39 and a nitride layer pacers of an oxide layer spacer 39 and a nitride layer spacer 40 contacting both side walls of the individual gate pattern formed by stacking the gate electrodes 37 and the gate hard masks 38, are formed.

Next, through an ion-implantation process, a plurality of source/drain junctions, i.e., storage node (SN) junctions 41 and a bit line (BL) junction 42, are formed.

Figure 6:
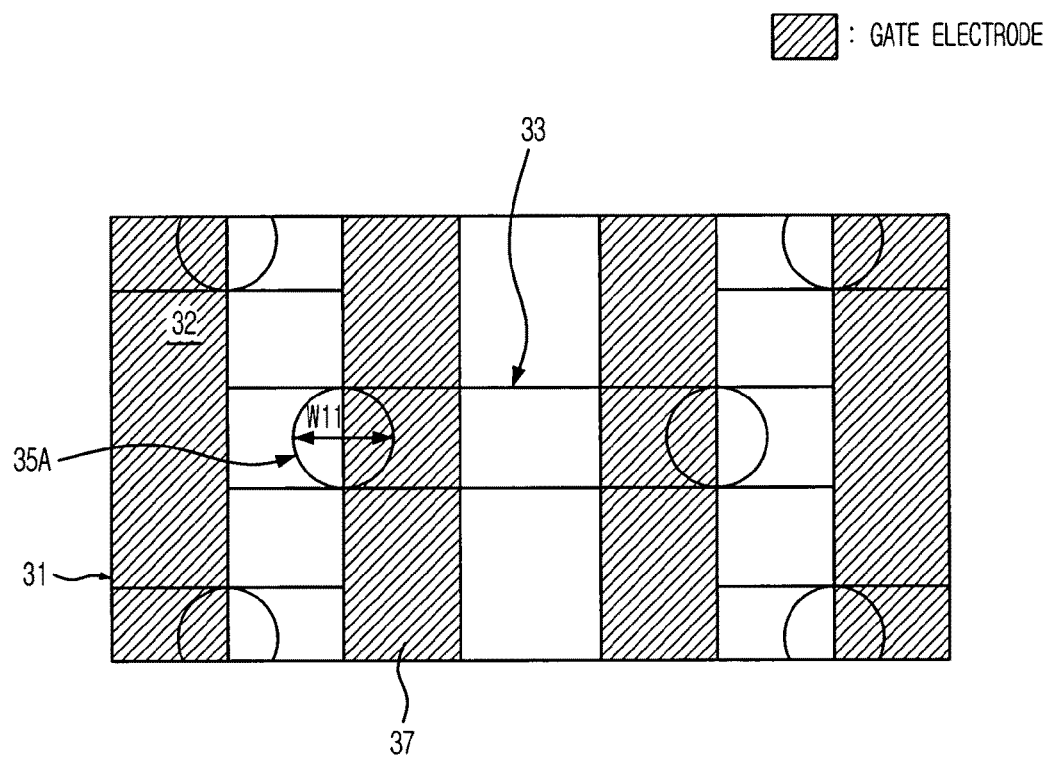
FIG. 6 is a top view illustrating a semiconductor device structure in accordance with a second embodiment of the present invention.

FIG. 6 is a top view illustrating a semiconductor device structure in accordance with a second embodiment of the present invention.

Referring to FIG. 6, an active region 33 is defined by a plurality of device isolation layers 32 on a predetermined portion of a substrate 31 and a plurality of recess patterns 35A for increasing an effective channel length are formed as shown in the first embodiment of the present invention.

At this time, a diameter W11 of the individual recess pattern 35A of the second embodiment of the present invention is smaller compared with the diameter W1 of the individual recess pattern 35 of the first embodiment of the present invention. For instance, the diameter W1 of the individual recess pattern 35 of the first embodiment of the present invention may be approximately 115 nm. However, the diameter W11 of the individual recess pattern 35A of the second embodiment of the present invention is in this case approximately 95 nm. Thus, the diameter W11 of the individual recess pattern 35A is identical with the width W2 of the minor axis of the active region 33, which in this case has a size of approximately 95 nm, of the first embodiment of the present invention.

The recess patterns 35A of the second embodiment of the present invention are formed by recessing only the active region 33 and thus, the plurality of device isolation layers 32 are not recessed in any direction. Meanwhile, the recess patterns 35 in accordance with the first embodiment of the present invention do not recess the device isolation layers 32 in a direction of the major axis of the individual gate electrode 37; however, the recess patterns 35 are formed by recessing up to the device isolation layers 32 in a direction of the minor axis of the individual gate electrode 37.

Figure 7:
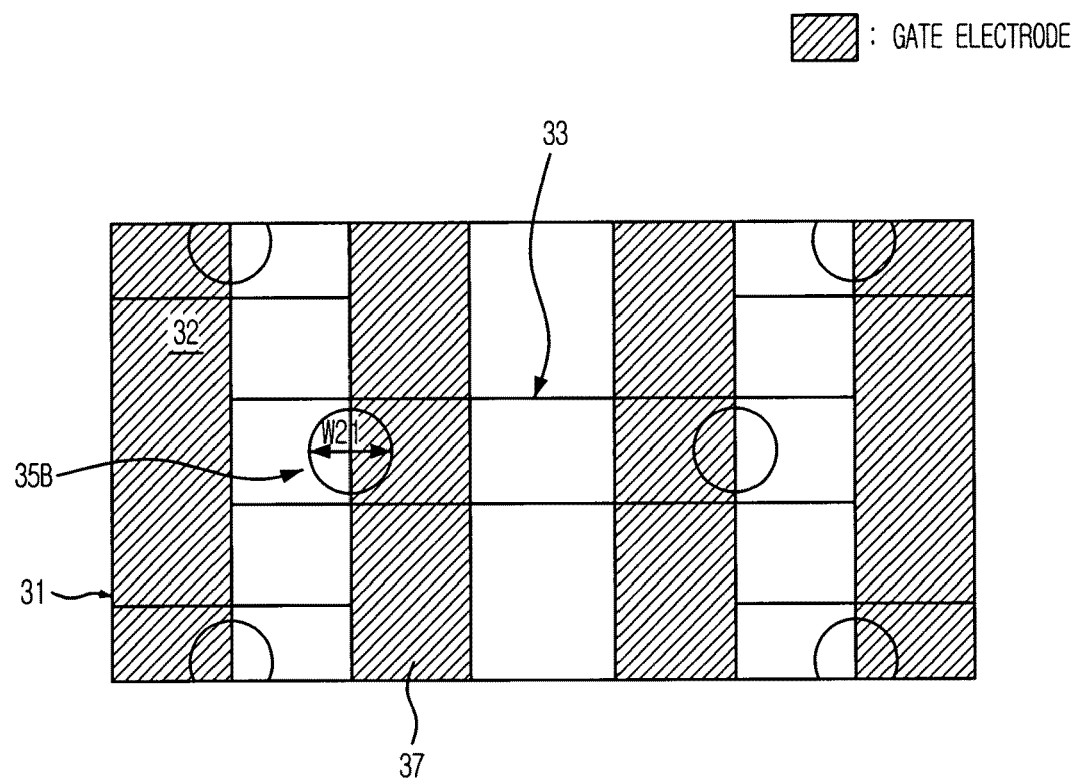
FIG. 7 is a top view illustrating a semiconductor device structure in accordance with a third embodiment of the present invention.

FIG. 7 is a top view illustrating a semiconductor device structure in accordance with a third embodiment of the present invention.

Referring to FIG. 7, an active region 33 is defined by a plurality of device isolation layers 32 on a predetermined potion of a substrate 31 and a plurality of recess patterns 35B for increasing an effective channel length are formed as shown in the first embodiment of the present invention.

At this time, a diameter W21 of the individual recess pattern 35B is smaller than the diameters W1 and W11 of the individual recess patterns 35 and 35A of the first and the second embodiments of the present invention. For instance, the diameter W1 of the individual recess pattern 35 is approximately 115 nm in accordance with the first embodiment and the diameter W11 of the individual recess pattern 35A is approximately 95 nm in accordance with the second embodiment of the present invention. However, the diameter W21 of the individual recess pattern 35B in this example is approximately 60 nm in accordance with the third embodiment of the present invention. Thus, the diameter W21 of the individual recess pattern 35B is smaller than the width W2 of the minor axis of the individual active region 33, which in this example is a size of approximately 95 nm.

In accordance with the third embodiment, the recess patterns 35B are formed at a size smaller than the width W2 of the minor axis of the active region 33, and the device isolation layers 32 are not recessed in any direction.

As described above, each of the gate electrodes 37 shown in the first to the third embodiments of the present invention is formed as a straight type. However, the first to the third embodiments of the present invention can be applied to a semiconductor device having a wave type gate electrode.

Figure 8:
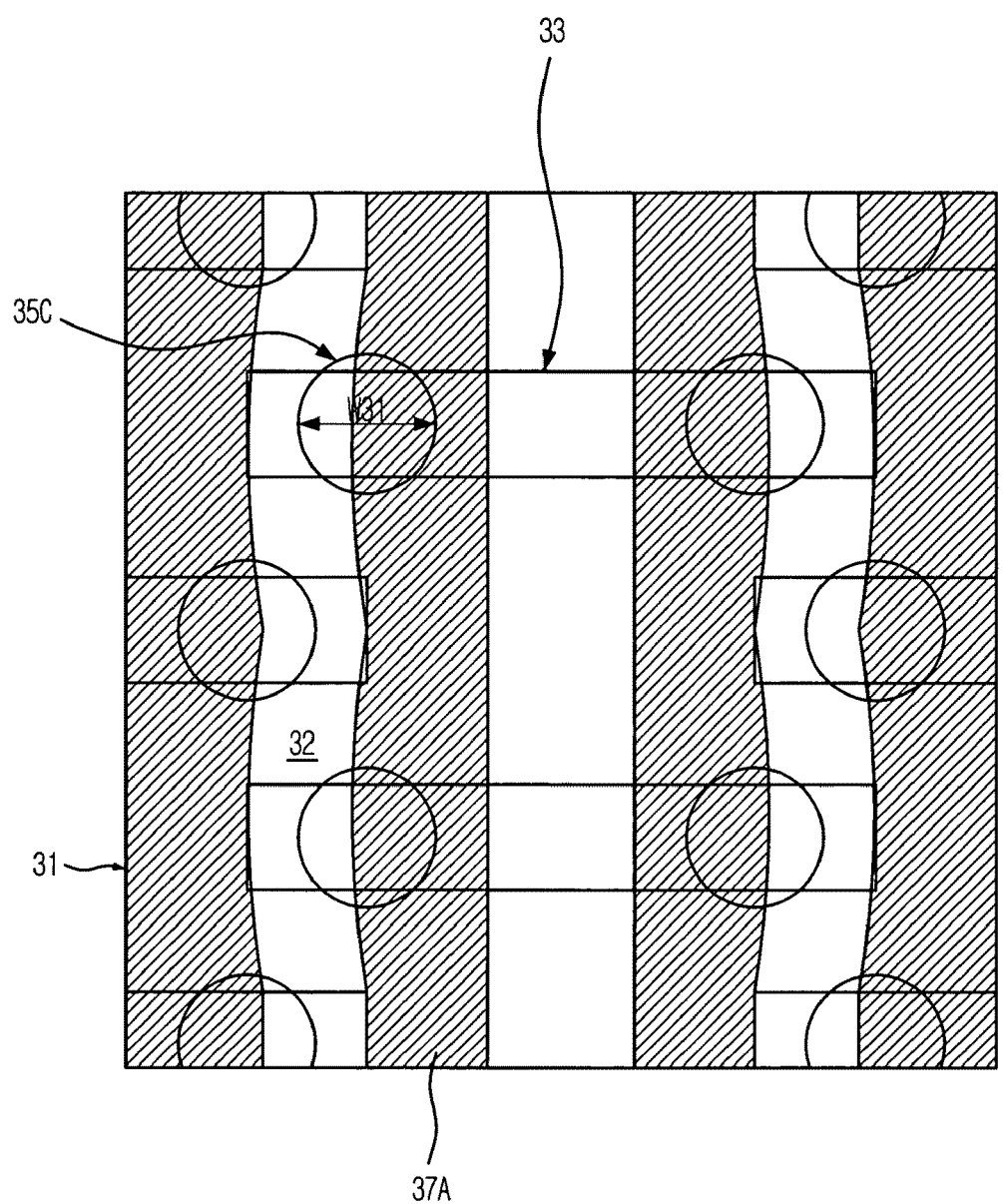
FIG. 8 is a top view illustrating a semiconductor device structure in accordance with a fourth embodiment of the present invention.

FIG. 8 is a top view illustrating a semiconductor device in accordance with a fourth embodiment of the present invention.

Referring to FIG. 8, similar to the first embodiment of the present invention, active regions 33 are defined by a plurality of device isolation layers 32 on a predetermined portion of a substrate 31 and a plurality of recess patterns 35C for increasing an effective channel length are formed.

At this time, a type and a diameter W31 of the individual recess pattern 35C are identical with those of the individual recess patterns 35 of the first embodiment of the present invention. For instance, the diameter W1 of the individual recess pattern 35 may be approximately 115 nm and the diameter W31 of the individual recess pattern 35C in that case is approximately 115 nm.

Unlike the first to the third embodiments of the present invention, a plurality of gate electrodes 37A of the fourth embodiment of the present invention are not formed straight but rather in the form of waves. That is, the gate electrodes 37A are wavy to have a roundly projected structure at portions in which the gate electrodes 37A coincide or overlap substantially with the recess patterns 35C.

As described above, if the gate electrodes are formed in the wave type, a topological height difference generally generated in a region in which the device isolation layer is formed gets removed. It is possible to solve a difficulty when using the roundly projected wave type gate electrodes.

That is, because of a property of the wave type gate pattern, often called a passing gate pattern, damage in a top photoresist layer resin pattern, or a notch, results due to a light reflection caused by a topology structure of a bottom portion of the gate pattern during the patterning process and a photo-exposure condition for forming the wave type mask pattern. Furthermore, a gate etching previously employed on the trench type recess pattern is performed more slowly than another gate etching employed on other regions, since there a gate polysilicon layer is formed more deeply in a depressed region. Thus, a gate line width on the opposite side of the passing gate pattern is extended, thereby improving an electrical property of the gate.

In accordance with the first to the fourth embodiments of the present invention, a twin omega ($\Omega$) gate type cell which the recess patterns obtained by forming the gate patterns at both sides of the BL junction region is exemplified. That is, the twin omega ($\Omega$) gate type cell is formed by recessing the active region, in which the SN junction regions formed in both sides of the BL junction are formed, in a trench type. At this time, a central portion of each of the trench type recess patterns is placed on an edge of the individual gate electrode.

Figure 9:
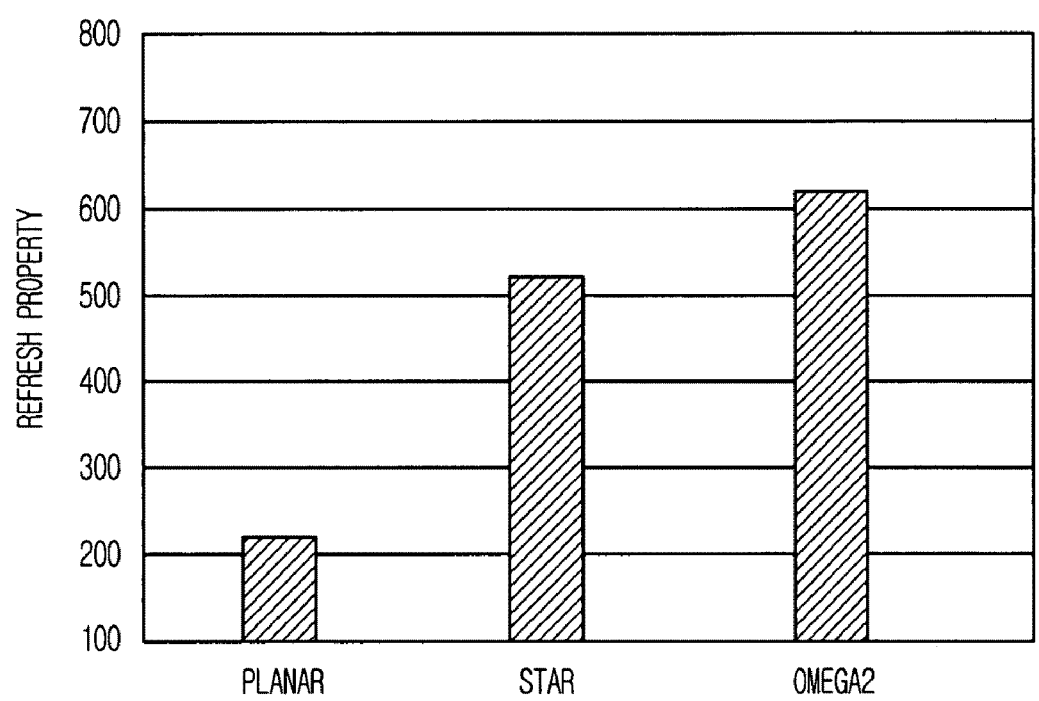
FIG. 9 is a graph exhibiting comparison results of a refresh property of each cell structure.

FIG. 9 is a graph comparing a refresh property of each cell structure measured at a threshold voltage of approximately 0.9 V, i.e., tREF@Vt=0.9 V.

Referring to FIG. 9, the twin omega gate type cell structure in accordance with the first to the fourth embodiments of the present invention shows much better properties than the conventional planar cell structure.

Figure 10A:
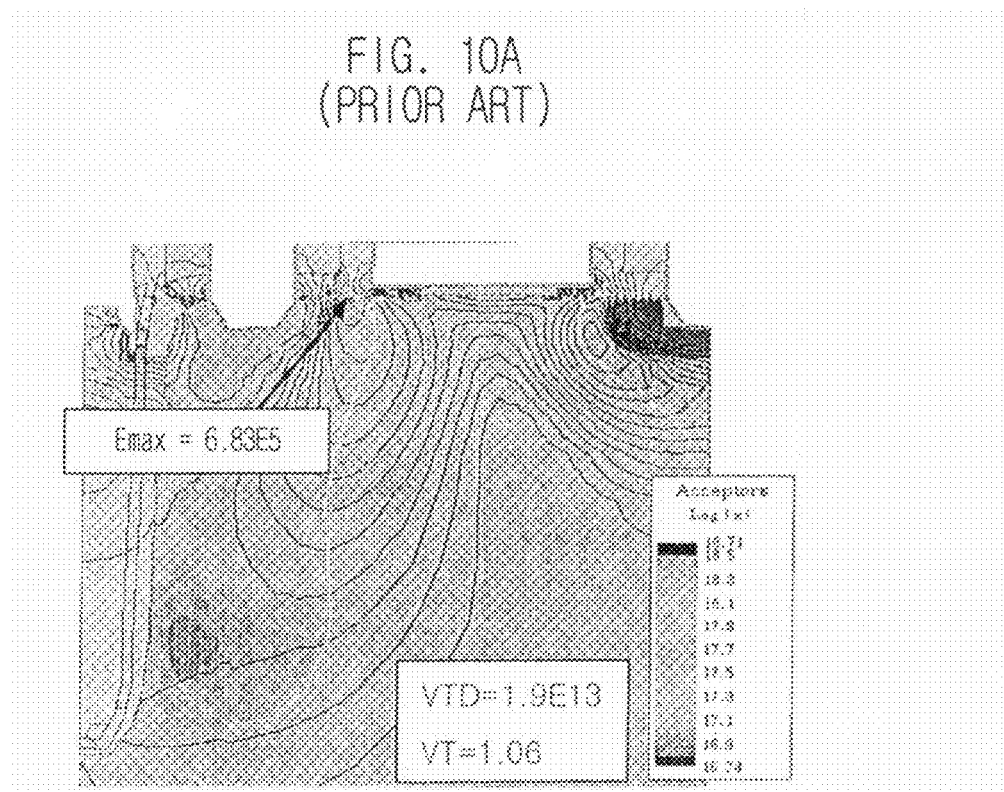
FIGS. 10A to 10C are simulation results comparing electric field distributions of different cell structures.
Figure 10B:
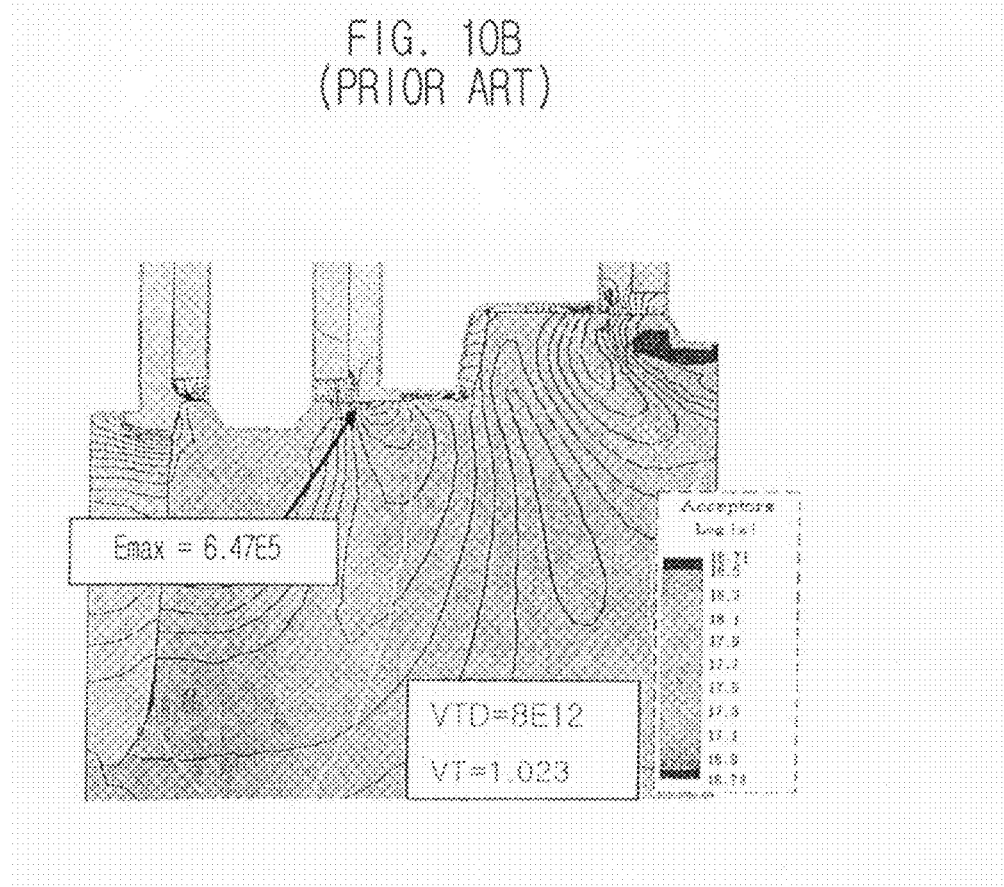
Figure 10C:
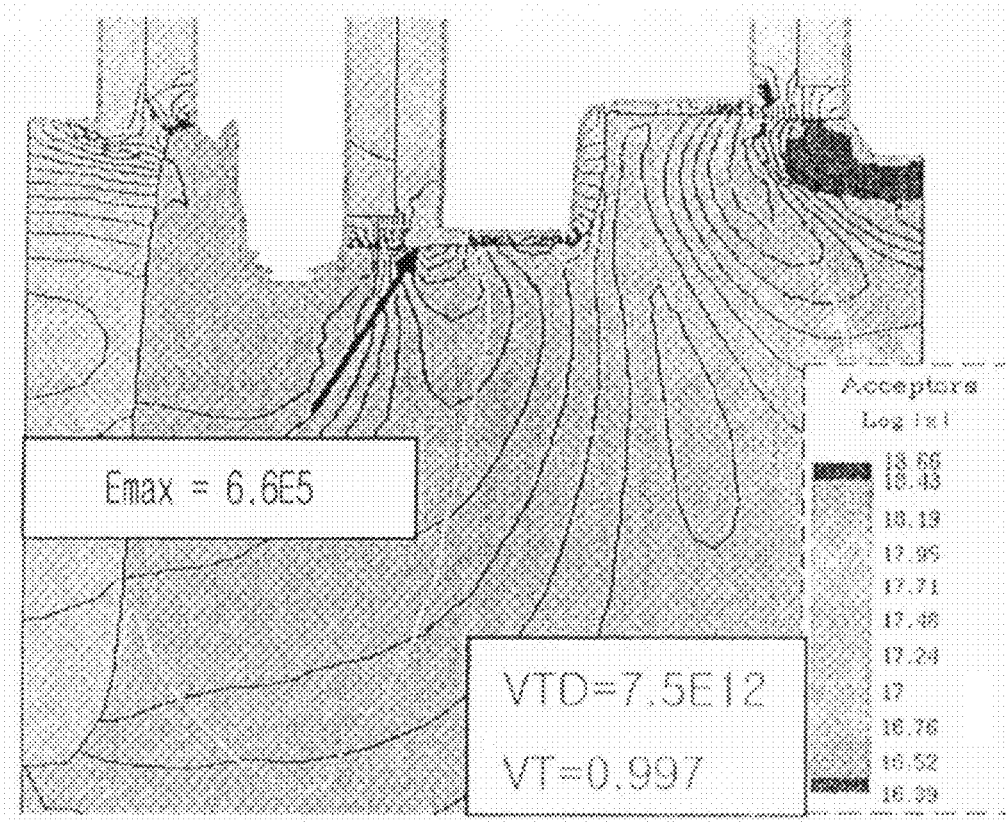

FIGS. 10A to 10C are simulation results comparing an electric field distribution of each cell structure, respectively. FIG. 10A shows the electric field distribution of the conventional planar cell structure. FIG. 10B shows the electric field distribution of the conventional STAR cell structure. FIG. 10C shows the electric field distribution of the twin omega gate type cell structure in accordance with the first to the fourth embodiments of the present invention.

Referring to FIGS. 10A to 10C, the conventional planar cell structure shows a very high electric field, i.e., Emax, of $6.83 \times 10^5$ V. However, the twin omega gate type cell structure of the present invention shows a relatively low electric field, i.e., Emax, of $6.6 \times 10^5$ V. Meanwhile, the electric field of the conventional STAR cell structure is lower than that of the conventional planar cell structure but higher than that of the twin omega gate type cell structure of the present invention.

As described above, although the conventional STAR cell structure has the electric field distribution lower than that of the twin omega gate type cell structure of the present invention, the conventional STAR cell structure provides a lower process margin compared with the twin omega gate type cell structure of the present invention. For instance, as for the twin omega gate type cell structure of the present invention, the recess patterns are formed in the trench type and accordingly, it is possible to decrease a contact resistance of a storage node contact. The conventional STAR cell structure is formed in the line/space (L/S) type and thus, a gate leaning phenomenon is generated. Since the twin omega gate type cell structure is a structure in which a predetermined portion of the gate electrode is stuck into the recess pattern, the twin omega gate type cell structure does not generate the gate leaning phenomenon.

Figure 11:
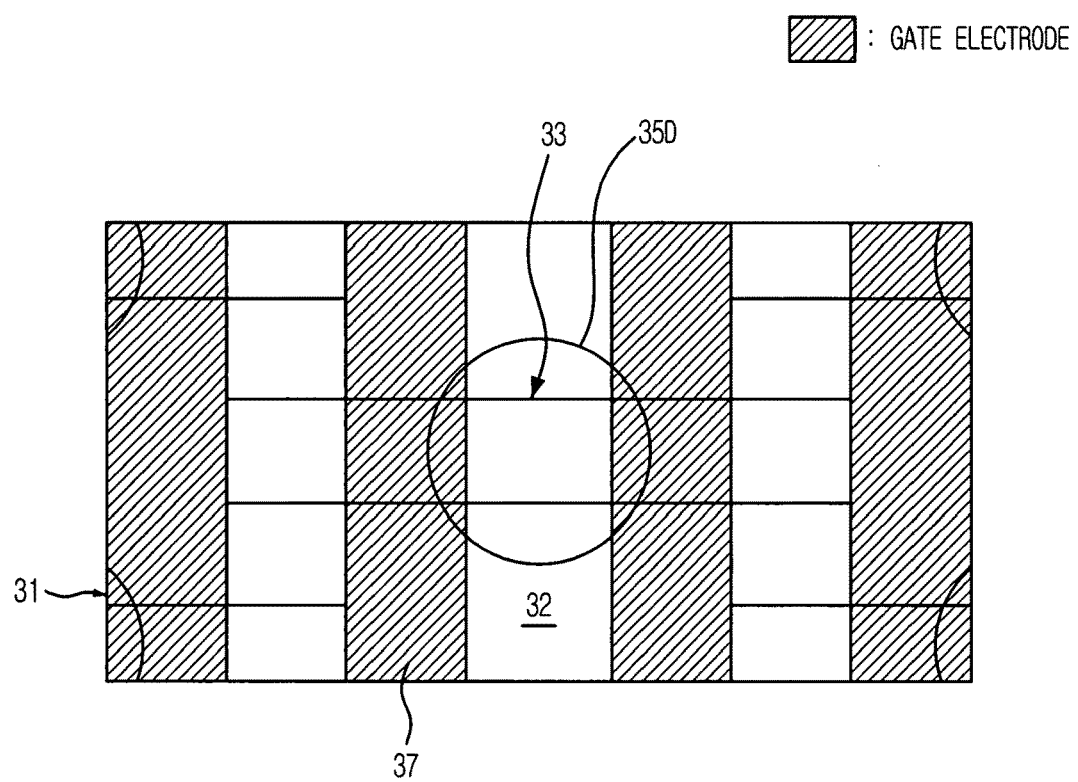
FIG. 11 is a top view illustrating a semiconductor device in accordance with a fifth embodiment of the present invention.

FIG. 11 is a top view illustrating a semiconductor device structure in accordance with a fifth embodiment of the present invention.

Referring to FIG. 11, an active region 33 is defined by a plurality of device isolation layers 32 on a predetermined portion of a substrate 31. A recess pattern 35D is formed in trench type trench structure, wherein the recess pattern 35D is formed over the BL junction region and the channel regions that are on both sides of the BL junction region.

That is, the trench of the recess pattern 35D is extended into the gate electrodes 37 placed on both sides of the recess pattern 35D. In more detail, one side of the recess pattern 35D is overlapped with the gate electrode 37 at one side and the other side of the recess pattern 35D is overlapped with the gate electrode 37 at the other side.

As described above, a device (hereinafter, referred to as a single omega gate structure) forming the recess pattern 35D only in the BL junction region between the gate electrodes 37 is more easily subjected to lithography patterning than the twin omega gate structure.

Figure 12:
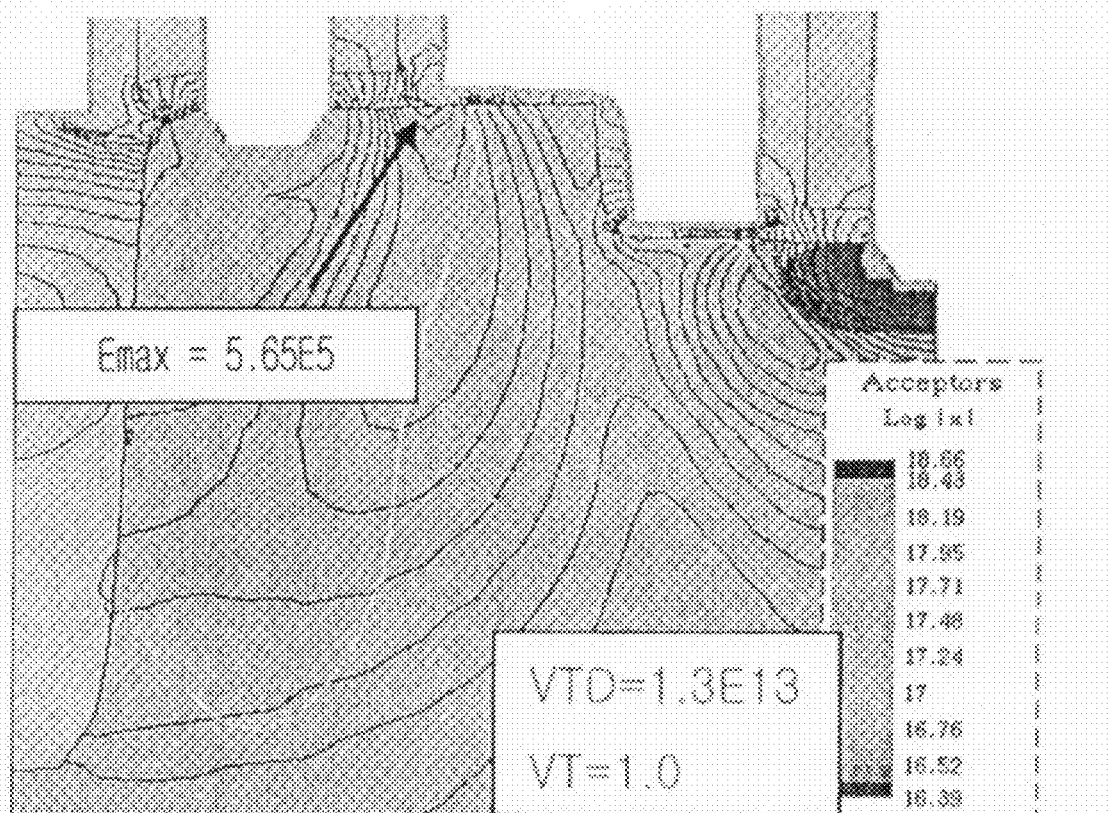
FIG. 12 is a simulation result illustrating an electric field distribution of a single omega gate structure in accordance with the fifth embodiment of the present invention.

FIG. 12 is a simulation result illustrating an electric field distribution of the single omega gate structure in accordance with the fifth embodiment of the present invention.

Referring to FIG. 12, the electric field of the single omega gate structure is approximately $5.65 \times 10^5$ V and thus, it is shown that the electric field of the single omega gate structure is lower than that of the twin omega gate type cell structure.

On the basis of the different embodiments of the present invention as described above, a recess pattern is formed in a trench type, thereby forming an asymmetric junction structure between a storage node (SN) junction region and a bit line (BL) junction region. Thus, a cell transistor structure recessing silicon in a semicircle type is formed on a bottom portion of a gate pattern. Accordingly, it is possible to secure a channel length and make it easy to secure tREF due to a decreased electric field resulted from reducing channel boron concentration. Also, an embodiment of the present invention is very effective with respect to stress in a thin layer during fabricating a trench type semiconductor device. Furthermore, an embodiment of the present invention provides a substrate with a topology structure which is more advantageous to a lithography process and thus, it is possible to increase a margin of a photolithography process and a width of a gate. Accordingly, it is possible to improve an electrical property of the gate.

The present application contains subject matter related to the Korean patent application No. KR 2005-0008741, filed in the Korean Patent Office on Jan. 31, 2005, the entire contents of which being incorporated herein by reference.

While the present invention has been described with respect to certain specific embodiments, it will be apparent to those skilled in the art that various changes and modifications may be made without departing from the spirit and scope of the invention as defined in the following claims.

What is claimed is:

1. A semiconductor device, comprising:
   a substrate including an active region divided into a plurality of storage node contact junction regions, a plurality of channel regions and a bit line contact junction region, wherein the storage node contact junction regions and the channel regions are lateral to each other and positioned parallel to a major axis of the active region, wherein the major axis is the X-axis of the active region;

a plurality of device isolation layers formed in the substrate and isolating the active region from a neighboring active region;

a plurality of recess patterns, each formed in a trench structure and extending from one of the storage node contact junction regions to one of the channel regions in a direction along the major axis of the active region;

a plurality of line type gate patterns, each filling a predetermined portion of one of the recess patterns formed in the channel regions in a direction crossing the major axis of the active region; and a plurality of storage node junctions, each formed below a predetermined portion of one of the recess patterns formed in the storage node contact junction regions.

2. The semiconductor device of claim 1, wherein the plurality of recess patterns are formed within a predetermined distance apart from the device isolation layers.

3. The semiconductor device of claim 1, wherein a central portion of one of the recess patterns is located at an edge portion of one of the gate patterns.

4. The semiconductor device of claim 1, wherein a diameter of one of the recess patterns is larger than a length of a minor axis of the active region, and a radius of one of the recess patterns is smaller than a line width of one of the gate patterns.

5. The semiconductor device of claim 1, wherein a diameter of one of the recess patterns is identical to a length of a minor axis of the active region, and a radius of one of the recess patterns is smaller than a line width of one of the gate patterns.

6. The semiconductor device of claim 1, wherein a diameter of one of the recess patterns is smaller than a length of a minor axis of the active region, and a radius of one of the recess patterns is smaller than a line width of one of the gate patterns.

7. The semiconductor device of claim 6, wherein the gate patterns are waved such that a side surface of one of the gate patterns is roundly projected at one of the recess patterns and an opposite side surface of said gate pattern is straight.

8. A semiconductor device, comprising:

a substrate including an active region divided into a plurality of storage node contact junction regions, a plurality of channel regions and a bit line contact junction region, wherein the storage node contact junction regions and the channel regions are lateral to each other and positioned parallel to a major axis of the active region, wherein the major axis is the X-axis of the active region;

a plurality of device isolation layers formed in the substrate and isolating the active region from a neighboring active region;

a plurality of recess patterns, each formed in a trench structure and formed over the bit line contact junction region and the channel regions in both sides of the bit line contact junction region in a direction along the major axis of the active region; and a plurality of line type gate patterns, each filling a predetermined portion of a respective one of the recess patterns formed over the channel regions in a direction crossing the major axis of the active region.

9. The semiconductor device of claim 8, wherein one side of the respective recess pattern overlaps a respective one of the gate patterns.

* * * * *